(12) United States Patent
Gruber et al.

(10) Patent No.: US 9,543,273 B2
(45) Date of Patent: Jan. 10, 2017

(54) REDUCED VOLUME INTERCONNECT FOR THREE-DIMENSIONAL CHIP STACK

(71) Applicant: International Business Machines Corporation, Armonk, NY (US)

(72) Inventors: Peter A. Gruber, Mohegan Lake, NY (US); Katsuyuki Sakuma, Fishkill, NY (US); Da-Yuan Shih, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 14/599,824

(22) Filed: Jan. 19, 2015

(65) Prior Publication Data
US 2016/0211242 A1    Jul. 21, 2016

(51) Int. Cl.
*H01L 21/00* (2006.01)
*H01L 25/065* (2006.01)
(Continued)

(52) U.S. Cl.
CPC ......... *H01L 25/0657* (2013.01); *H01L 21/565* (2013.01); *H01L 23/3107* (2013.01); *H01L 24/06* (2013.01); *H01L 24/11* (2013.01); *H01L 24/17* (2013.01); *H01L 24/81* (2013.01); *H01L 25/50* (2013.01); *H01L 2224/0401* (2013.01); *H01L 2224/11334* (2013.01); *H01L 2224/16012* (2013.01); *H01L 2224/16145* (2013.01); *H01L 2224/16503* (2013.01); *H01L 2224/17181* (2013.01); *H01L 2224/811* (2013.01); *H01L 2224/8109* (2013.01);
(Continued)

(58) Field of Classification Search
CPC ........ H01L 21/565; H01L 24/06; H01L 24/11; H01L 24/17; H01L 24/81; H01L 25/0657; H01L 25/50
See application file for complete search history.

(56) References Cited

U.S. PATENT DOCUMENTS 6,847,105 B2   1/2005  Koopmans
6,979,591 B2   12/2005 Hedler et al.
(Continued)

FOREIGN PATENT DOCUMENTS

TW          200908280          2/2009

*Primary Examiner* — Whitney T Moore
*Assistant Examiner* — Joseph Galvin, III
(74) *Attorney, Agent, or Firm* — Daniel P. Morris, Esq.; Otterstedt, Ellenbogen & Kammer, LLP (57) ABSTRACT

A method of forming a reduced volume interconnect for a chip stack including multiple silicon layers, the method including: forming multiple conductive structures, each of at least a subset of the conductive structures having a volume of conductive material for a corresponding under bump metallurgy pad onto which the conductive structure is transferred that is configured such that a ratio of an unreflowed diameter of the conductive structure to a diameter of the corresponding pad is about one third-to-one or less; transferring the conductive structures to the silicon layers; stacking the silicon layers in a substantially vertical dimension such that each of the conductive structures on a given silicon layer is aligned with a corresponding electrical contact location on an underside of an adjacent silicon layer; and heating the interconnect so as to metallurgically bond multiple electrical contact locations of adjacent silicon layers.

13 Claims, 9 Drawing Sheets

(51) Int. Cl.
  *H01L 25/00*   (2006.01)
  *H01L 23/00*   (2006.01)
  *H01L 23/31*   (2006.01)
  *H01L 21/56*   (2006.01)

(52) U.S. Cl.
  CPC .......... *H01L 2224/8112* (2013.01); *H01L 2224/8121* (2013.01); *H01L 2224/81201* (2013.01); *H01L 2224/81815* (2013.01); *H01L 2225/06513* (2013.01); *H01L 2225/06517* (2013.01); *H01L 2225/06541* (2013.01); *H01L 2924/15311* (2013.01)

(56) References Cited

U.S. PATENT DOCUMENTS

| | | | |
|---|---|---|---|
| 2009/0072374 A1 | 3/2009 | Dobritz et al. | |
| 2010/0025863 A1* | 2/2010 | Gruber | H01L 23/49811 257/778 |
| 2010/0244226 A1 | 9/2010 | Sabatini et al. | |
| 2011/0201194 A1* | 8/2011 | Gruber | H01L 21/4853 438/613 |
| 2011/0210440 A1 | 9/2011 | Sabatini et al. | |
| 2014/0077358 A1* | 3/2014 | Chen | H01L 21/76885 257/737 |
| 2014/0196746 A1* | 7/2014 | Dinsmore | H01L 21/02063 134/1.1 |
| 2015/0184446 A1* | 7/2015 | Veerasamy | E06B 3/6775 428/34 |

* cited by examiner

REDUCED VOLUME INTERCONNECT FOR THREE-DIMENSIONAL CHIP STACK

BACKGROUND OF THE INVENTION

The present invention relates generally to the electrical, electronic and computer arts, and, more particularly, to integrated circuit (IC) interconnects.

Three-dimensional (3D) chip stacking relies on metallized interconnect structures between silicon layers to enable electrical communication between the respective chips. Chip stacking, as the name suggests, refers to an IC packaging methodology in which a completed computer chip (e.g., dynamic random access memory (DRAM)) is placed on top of another chip (e.g., a central processing unit (CPU)). As a result, two chips that were traditionally centimeters apart on a circuit board are now less than a millimeter apart. This reduces power consumption and also improves bandwidth by a significant amount.

Although several options exist for making 3D interconnect structures, soldering remains one of the most popular. However, plating, evaporation or other solder deposition methods are typically expensive and complex and limit the alloys that may be used. Additionally, conventional solder deposition methods produce a spacing between adjacent chips, referred to herein as standoff height, which substantially increases the overall package height of the chip stack and furthermore is not sufficient for high-frequency signals. The shorter interconnect wires will decrease both the average parasitic load capacitance and the resistance. Also there is a demand to make the total stacked package height as low as possible in a mobile application industry market.

BRIEF SUMMARY

Principles of the invention, in accordance with embodiments thereof, provide techniques for reducing interconnect height in a 3D chip stack. In one aspect, a method of forming a reduced volume interconnect for a chip stack including multiple silicon layers includes: forming multiple conductive structures, each of at least a subset of the conductive structures having a volume of conductive material for a corresponding under bump metallurgy pad onto which the conductive structure is transferred that is configured such that a ratio of an unreflowed diameter of the conductive structure to a diameter of the corresponding pad is about one third-to-one or less; transferring the conductive structures to the silicon layers; stacking the silicon layers in a substantially vertical dimension such that each of the conductive structures on a given silicon layer is aligned with a corresponding electrical contact location on an underside of an adjacent silicon layer; and heating the interconnect so as to metallurgically bond multiple electrical contact locations of adjacent silicon layers in such a manner that at least a given one of the conductive structures between aligned electrical contact locations on corresponding adjacent silicon layers collapses to reduce an interconnect gap therebetween.

In accordance with another embodiment of the disclosure, a method of forming a reduced volume electrical interconnect for a chip stack including multiple silicon layers includes: forming a plurality of conductive structures; transferring the conductive structures to the silicon layers; stacking the silicon layers in a substantially vertical dimension such that each of the conductive structures on a given silicon layer is aligned with a corresponding electrical contact location on an underside of an adjacent silicon layer; and heating the interconnect so as to metallurgically bond multiple electrical contact locations of adjacent silicon layers in such a manner that at least a given one of the conductive structures between aligned electrical contact locations on corresponding adjacent silicon layers collapses to reduce an interconnect gap therebetween. Each of at least a subset of the conductive structures is formed having a volume of conductive material that is configured such that a percentage of intermetallic compounds in a junction between the conductive structure and corresponding aligned under bump metallurgy (UBM) pads formed on corresponding opposing surfaces of adjacent silicon layers is about forty percent or more of a total volume of conductive material.

A reduced volume electrical interconnect for a 3D chip stack, according an aspect of the disclosure, includes: multiple silicon layers having multiple electrical contact locations formed on a surface thereof; multiple UBM pads, each of the UBM pads being formed between a corresponding one of the silicon layers and a corresponding one of the electrical contact locations; and multiple conductive structures, each of the conductive structures being aligned with a corresponding one of the electrical contact locations and having a volume of conductive material for a corresponding one of the UBM pads that is configured such that a ratio of an unreflowed diameter of the conductive structure to a diameter of the corresponding pad is about one third-to-one or less. The interconnect is configured having the plurality of silicon layers stacked in a substantially vertical dimension such that each of the conductive structures on a given silicon layer is aligned with a corresponding electrical contact location on an underside of an adjacent silicon layer. The conductive structures, when heated to a prescribed temperature, metallurgically bond the electrical contact locations of adjacent silicon layers in such a manner that at least a given one of the conductive structures between aligned electrical contact locations on corresponding adjacent silicon layers collapses to thereby reduce an interconnect gap therebetween.

In accordance with another aspect of the disclosure, a reduced volume electrical interconnect for a 3D chip stack includes: multiple silicon layers having multiple electrical contact locations formed on a surface thereof; multiple UBM pads, each of the UBM pads being formed between a corresponding one of the silicon layers and a corresponding one of the electrical contact locations; and multiple conductive structures. Each of the conductive structures is aligned with a corresponding one of the electrical contact locations and has a volume of conductive material for a corresponding one of the UBM pads that is configured such that a ratio of an unreflowed diameter of the conductive structure to a diameter of the corresponding pad is about one third-to-one or less. Each of at least a subset of the conductive structures is formed having a volume of conductive material that is configured such that a percentage of intermetallic compounds in a junction between the conductive structure and corresponding aligned UBM pads formed on corresponding opposing surfaces of adjacent silicon layers is about forty percent or more of a total volume of conductive material.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Techniques of the present invention can provide substantial beneficial technical effects. For example, one or more embodiments may provide reduced standoff height, which reduces the overall height/size of the interconnect and reduces stacked package height, improved power efficiency, increased bandwidth and/or reduced cost.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Embodiments of the present invention will be described herein in the context of illustrative interconnect structures for 3D chip stacks and for methods of making same. It is to be appreciated, however, that the invention is not limited to the specific apparatus and/or methods illustratively shown and described herein. Rather, embodiments of the invention are directed to a reduced volume interconnect for decreasing an interconnect height between adjacent silicon layers of a chip stack. Moreover, it will become apparent to those skilled in the art given the teachings herein that numerous modifications can be made to the embodiments shown that are within the scope of the claimed invention. Thus, no limitations with respect to the embodiments shown and described herein are intended or should be inferred.

As previously stated, 3D chip stacking relies on metallized interconnect structures formed between adjacent silicon layers for providing electrical communication therebetween; solder remains the preferred option for making these interconnect structures. Unfortunately, plating, evaporation, or other solder deposition methods are often expensive, complex, and limit the alloys that may be used. A controlled collapse chip connection new process (C4NP) semiconductor packaging technology, an alternative to an electroplating process, overcomes some of these limitations. However, the C4NP technology produces a standoff height that substantially increases the overall height of the chip stack and is generally not well-suited for high-frequency signal transmission.

Figure 1A:
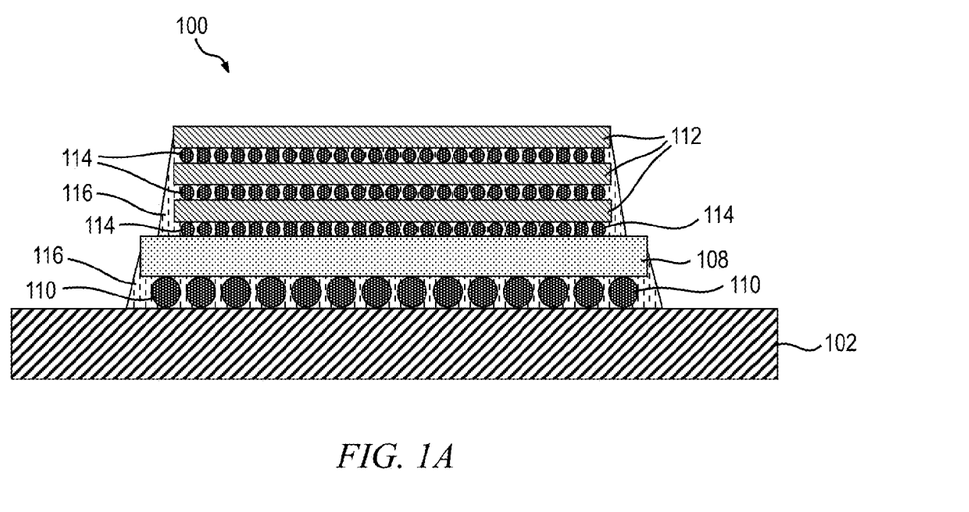
FIGS. 1A and 1B are cross-sectional views depicting at least a portion of an exemplary 3D chip stack in which techniques according to one or more embodiments of the invention can be employed.
Figure 1B:
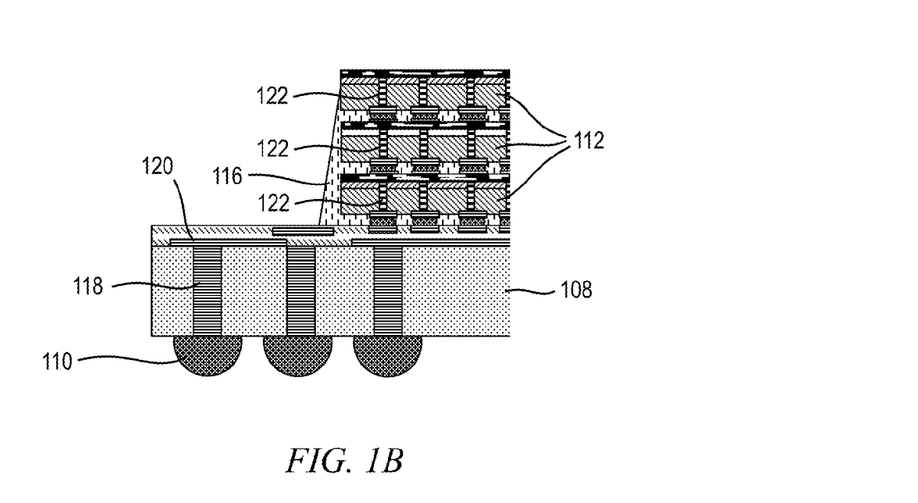

FIGS. 1A and 1B are cross-sectional views depicting at least a portion of an exemplary 3D chip stack in which techniques according to one or more embodiments of the invention can be employed. The chip stack module 100 includes a substrate 102 electrically connected to a interposer 108, which is stacked vertically above at least a portion of the substrate, by way of a first plurality of conductive structures 110 (e.g., C4 solder balls). The interposer 108, such as, for example, a silicon, glass or organic interposer, may comprise, for example, a microprocessor or other circuit component, positioned vertically above at least a portion of the substrate using a first plurality of conductive structures 110 (e.g., C4 solder balls). The interposer 108 is electrically connected with one or more other die 112, each of which may comprise, for example, memory stacked vertically above at least a portion of the interposer using a corresponding plurality of conductive structures 114, as shown.

One technique for electrically interconnecting the interposer 108 and various stacked die 112, which is perhaps the most complex, is by using conductive vias, such as, for example, through-silicon vias (TSV) or through-glass vias (TGV). With TSV, vertical conductive channels (e.g., copper, tungsten) are built into each die, so that when they are placed on top of one another, the TSVs connect the chips together. With particular reference to FIG. 1B, which illustrates a portion of the exemplary chip stack module 100 depicted in FIG. 1A, a first plurality of vias 118 (e.g., TSV or TGV) are formed through the interposer 108 for connecting the first plurality of conductive structures 110 with a wiring later 120 formed on an upper surface of the interposer. A second plurality of vias (e.g., TSV) 122 formed through the respective die 112 are used to connect corresponding conductive structures 114 with one another. The 3D chip stack module 100, in this embodiment, is carried out using flip-chip technology and an underfill material 116 is used in the spaces between chips (e.g., between chips 112, or between interposer 108 and chip 112) and between chip and substrate (e.g., between interposer 108 and substrate 102), primarily for increasing the structural integrity of the chip stack module.

Figure 2:
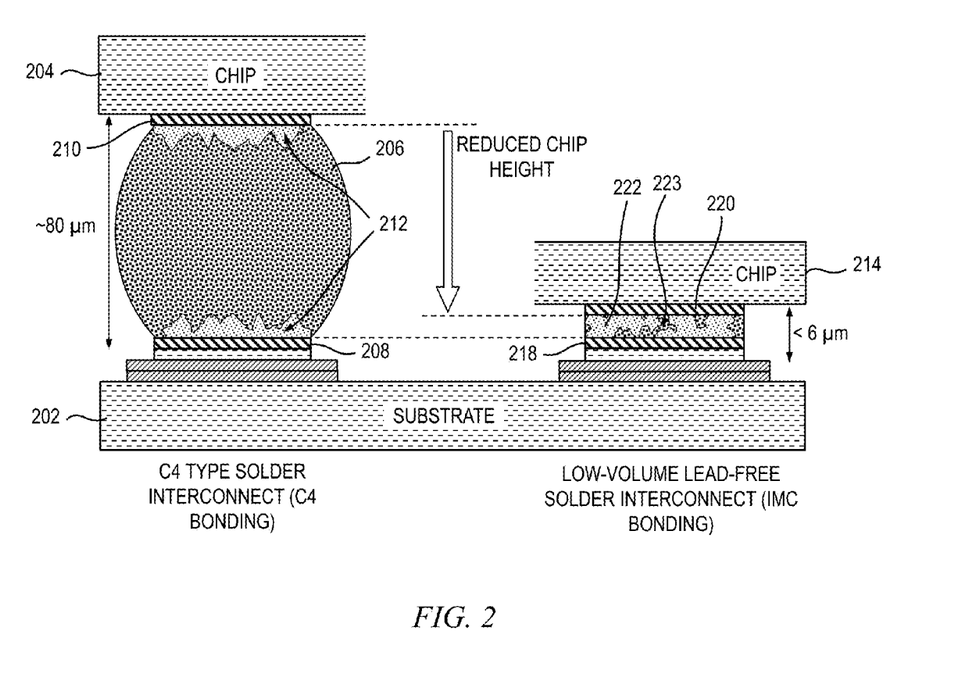
FIG. 2 is a cross-sectional view conceptually depicting a comparison between an exemplary controlled collapse chip connection (C4) and an exemplary low-volume interconnect for a 3D chip stack.

FIG. 2 is a cross-sectional view conceptually depicting a comparison between an exemplary controlled collapse chip connection (C4) and an exemplary low-volume interconnect for a 3D chip stack. The two types of interconnects are shown formed on a common substrate 202. In the case of the C4 interconnect, a chip 204 is electrically connected with a corresponding circuit on the substrate 202 via one or more C4 solder balls 206. Each solder ball 206 preferably contacts corresponding wetting pads, 208 and 210, formed on surfaces of the substrate 202 and chip 204, respectively, the wetting pads being aligned with one another. At junctions between the solder 206 and the wetting pads 208, 210, intermetallic compounds (IMC) 212 are formed during the bonding or solder reflow processes, particularly when using C4 solder balls; in this illustration, an 80-micron C4 solder ball is used.

In the case of the low-volume solder interconnect, a chip 214 is electrically connected with a corresponding circuit on the substrate 202 via one or more low-volume lead-free solder structures. The low-volume solder structure is preferably attached to corresponding wetting pads, 218 and 220, on surfaces of the substrate 202 and chip 214, respectively. Unlike standard 100-micron C4 solder balls, very small solder volumes (e.g., less than about ten microns in height, as in the example shown) form IMC 222 in junctions between solder structure 223 and the respective wetting pads 218, 220 during the bonding or reflow processes. Due at least in part to the reduced volume of conductive material (e.g., solder) used to form the interconnect, the percentage of IMC 222 in the junction between wetting pads 218 and 220 for the low-volume solder structure according to one or more embodiments of the invention will be significantly higher (e.g., about forty percent or more) compared to the percentage of IMC 212 between wetting pads 208 and 210 in a standard C4 process (e.g., generally, about ten percent or less).

C4 solder interconnects require a larger spacing between balls and higher joint gaps than low-volume solder interconnects. Lead-free solder interconnects, such as, for example, tin (Sn) or indium (In), or alloys including tin, silver and/or copper, tin/silver/copper (Sn/Ag/Cu), tin/silver (Sn/Ag), etc., can be joined at a relatively low temperature and form an intermetallic phase with a melting temperature much higher than the low bonding temperature. For instance, the melting point of indium is 156 degrees Celsius (° C.) and the melting point of the resulting Cu/In IMC is expected to be more than about 400° C.; higher than the standard solder reflow temperature (260° C.) in the subsequent bonding. This is a desirable feature for 3D chip-stack processes because high thermal stability is needed to allow repetition of the same bonding process steps for subsequent chip-stack assemblies, or for other subsequent die-stack or module level assemblies. In addition, a low-temperature bonding process has the potential to overcome issues such as wafer or chip warpage during alloying up.

Some benefits of low-volume solder interconnects include, but are not limited to: (i) increased vertical heat transfer within a 3D die stack; (ii) extension to fine-pitch interconnection design rules; and (iii) a temperature hierarchy for low temperature bonding but also supporting subsequent process steps with less re-melting than C4 interconnects. The temperature hierarchy supports the creation of tested and known-good die (KGD) stacks without the risk of die stack interconnections melting again during reflow for module level assembly or surface mount assembly to a board. Once created, the IMC bonds have good thermal stability.

Figure 3A:
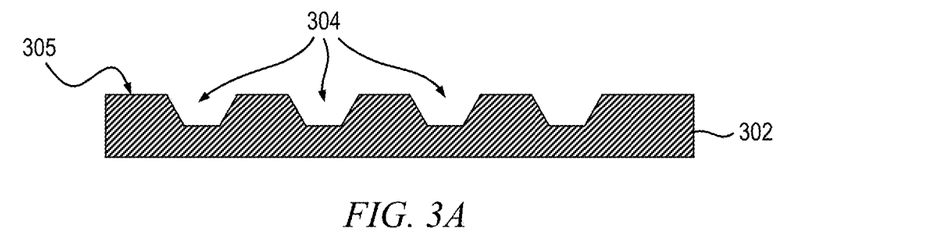
FIGS. 3A through 3E are cross-sectional views depicting at least a portion of an illustrative controlled collapse chip connection new process (C4NP) solder transfer process for forming interconnect structures between silicon layers that are of standard (i.e., full) height.

FIGS. 3A through 3E are cross-sectional views depicting an illustrative C4NP solder transfer process used to form interconnect structures between silicon layers that are of standard (i.e., full) height. With reference to FIG. 3A, a mold 302 includes a plurality of depressions or cavities 304 in an upper surface 305 of the mold. In this embodiment, each of the cavities 304 has a trapezoidally-shaped cross section and does not extend completely through the mold 302. Such a trapezoidal shape is produced, in accordance with one or more embodiments, by laser ablation in polyimide. Typically, a polyimide (PI) layer is laser ablated and forms tapered sidewalls. C4NP molds are usually glass, and the cross section of the cavities 304 form a flattened hemisphere, in this embodiment.

The cavities 304 are adapted to receive solder or an alternative conductive material, which may be introduced into the cavities in molten form via an injection molding process or the like, as will be understood by those skilled in the art. Alloy flexibility includes multi-component lead-free alloys. The width and depth of each of the cavities 304 will define a volume of the resulting interconnect structures.

In one embodiment of the present invention, the mold 302 may be formed using a semiconductor material, such as, for example, borosilicate glass, although the invention is not limited to glass molds. As stated above, when borosilicate glass is used, the cavities 304 will be formed having cross sections shaped as flattened hemispheres by etching, in one or more embodiments. The glass molds are reusable, thus keeping costs low.

Figure 3B:
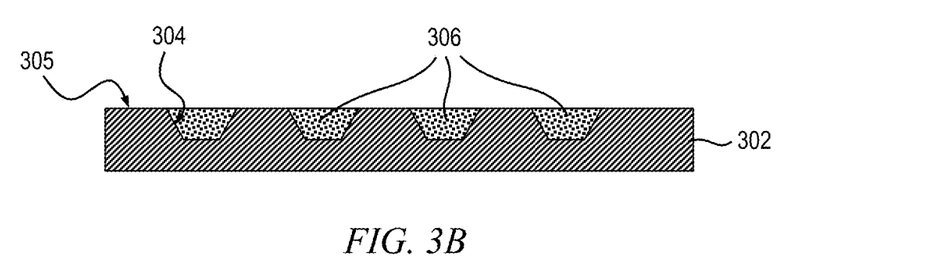
Figure 3C:
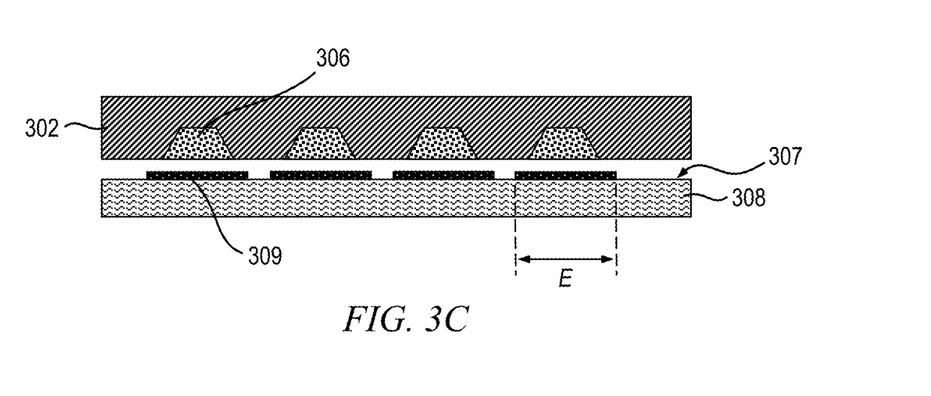
Figure 3D:
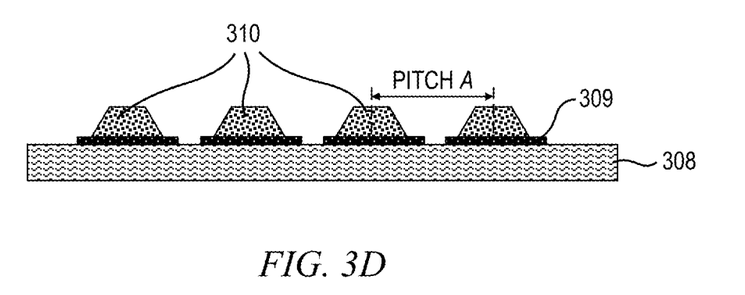

As shown in FIG. 3B, each of the cavities 304 in the mold 302 are filled with a conductive material 306, preferably molten solder, and made substantially planar with the upper surface 305 of the mold. As shown in FIG. 3C, once the molten solder material 306 in cavities 304 is allowed to solidify, the mold 302 is inverted (i.e., turned upside down) and placed over under bump metallurgy (UBM) pads 309 on an upper surface 307 of a corresponding workpiece 308, which may be one of a plurality of chips forming a 3D chip stack. A width, E, of each of at least a subset of the UBM pads 309, in this embodiment, is slightly larger than a width of a corresponding one of the cavities 304. In FIG. 3D, solid conductive structures 310 (e.g., solid solder structures) are transferred from the mold 302 to the upper surface of the workpiece 308. In the process of conductive material transfer, all solder in a mold is again melted and transferred onto the UBM structure of a silicon wafer and then solidified. A spacing or pitch between adjacent conductive structures 310 is set to a prescribed distance, A. Although the invention is not limited to any specific pitch A, the spacing between adjacent conductive structures 310 should be selected such that an electrical short does not occur even after subsequent processing.

Figure 3E:
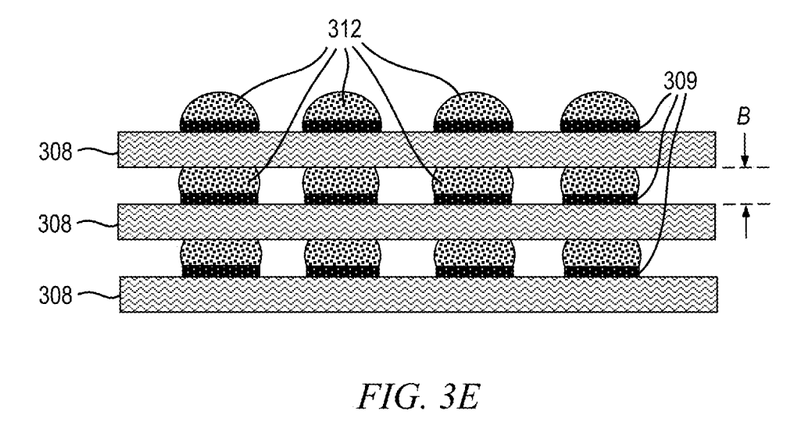

A volume of each of the conductive structures 310, in a standard C4NP process, will be selected such that a diameter of the conductive structure is substantially equal to one half of the pitch A. With reference to FIG. 3E, when stacked vertically on top of one another, the conductive structures on corresponding workpieces (chips) 308 will form interconnections 312 between adjacent workpieces. The interconnections 312 have a standoff height associated therewith which defines a minimum spacing, B, referred to herein as a standard interface gap, between adjacent chips 308. The shape of the interconnections 312 will be attributable primarily to a surface tension of the solder (or other material, in other embodiments) forming the interconnections.

With a standard volume solder bump, the minimum spacing B prevents stacked chips from being positioned too close together, thereby increasing an overall height of the 3D stacked chip. Moreover, the standoff height of the standard volume interconnections 312 is not well-suited for use in high-frequency signal applications, wherein a reduced minimum spacing between silicon layers is desired. An underfill material, including filler content comprising filler particles of a set size, is used to fill the gap between silicon layers. But thermal conductivity values for typical underfill materials are 0.3 to 0.5 W/m-K, which is worse than that of silicon (149 W/m-K). From a thermal point of view, reduced minimum spacing between silicon layers is also desired.

In accordance with an aspect of the invention, a reduced volume interconnect is provided which is able to achieve several important benefits compared to standard 3D chip stack interconnections, including, but not limited to, reduced overall height/size of the interconnect, improved power efficiency, increased bandwidth, and/or reduced cost. FIGS. 4A through 4E are cross-sectional views depicting at least a portion of an exemplary process for forming a reduced volume interconnect for a 3D chip stack, according to an embodiment of the invention.

Figure 4A:
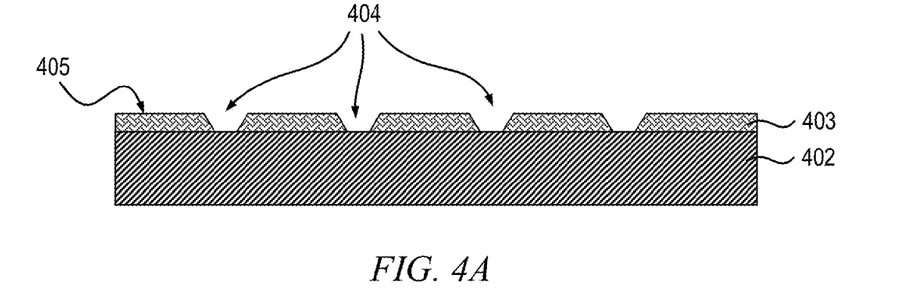
FIGS. 4A through 4E are cross-sectional views depicting at least a portion of an exemplary process for forming a reduced volume interconnect for a three-dimensional chip stack, according to an embodiment of the invention.

With reference to FIG. 4A, a mold 402 includes a plurality of depressions or cavities 404 in an upper surface 405 of the mold. In this embodiment, each of the cavities 404 has a trapezoidally-shaped cross section and does not extend completely through the mold 402. The cavities 404 may be formed in a manner consistent with the cavities 304 shown in FIG. 3A and described above. Although it is to be appreciated that the shape and/or depth of the cavities 404 are not limited by the present invention, a volume of the cavities in the mold 402 is configured to be less compared to the cavities 304 shown in FIG. 3A. The cavities 404 are preferably aligned with corresponding electrical contact locations on a chip or substrate and are adapted to receive solder or an alternative conductive material, which is preferably introduced into the cavities in molten form, for example via an injection molding process or the like, as will be understood by those skilled in the art. (See, e.g., U.S. Pat. No. 5,244,143 to Ference et al., which describes an apparatus and method for injection molding solder, the disclosure of which is incorporated herein by reference in its entirety.) The width and depth of each of the cavities 404 will define a volume of each of the corresponding interconnect structures.

Figure 4B:
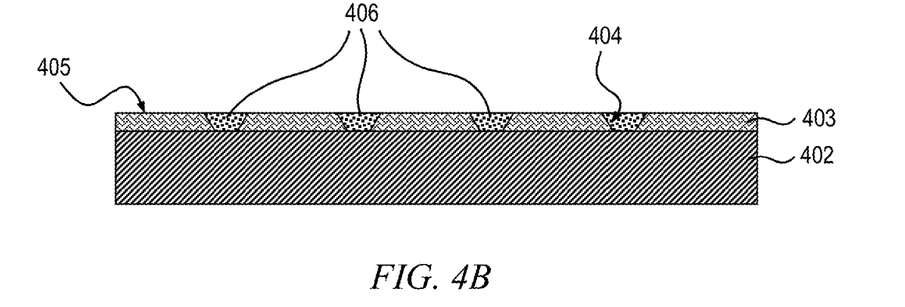

As shown in FIG. 4B, each of the cavities 404 in the mold 402 are filled with a conductive material 406, preferably molten solder. In an exemplary injection molding process, the mold 402 is heated to a temperature at or above the melting point of the conductive material 406 and the molten conductive material is forced into the cavities 404. An injection plate or similar mechanism is then advanced to slide over the upper surface 405 of the mold 402 to wipe away the excess conductive material 406 above the upper surface of the mold to thereby make the conductive material in the cavities 404 substantially planar with the upper surface of the mold.

Figure 4C:
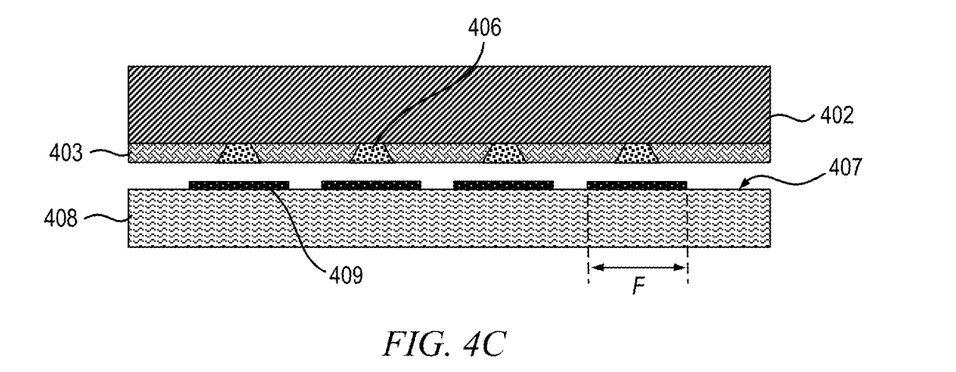
Figure 4D:
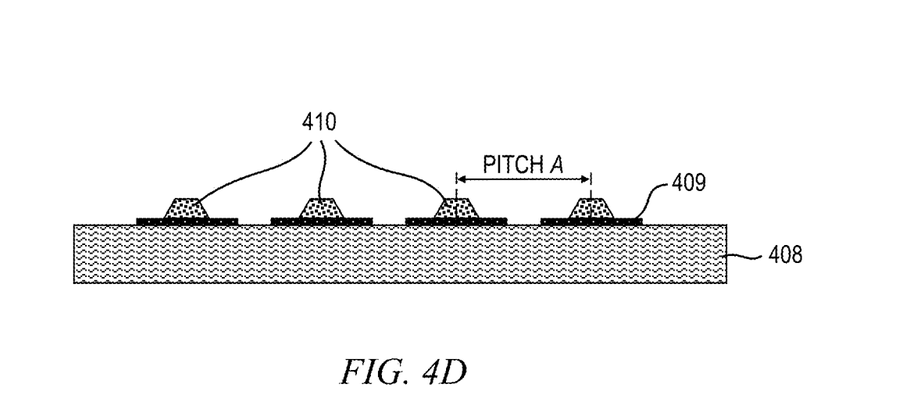

As shown in FIG. 4C, once the molten conductive material 406 in cavities 404 is allowed to solidify, the mold 402 is inverted and placed over UBM pads 409 on an upper surface 407 of a corresponding workpiece 408. The workpiece 408 can be, for example, a semiconductor chip (a plurality of which may form a 3D chip stack), a substrate, such as, for example, silicon (e.g., semiconductor packaging substrate), or a dummy substrate onto which the injection-molded conductive material adheres (e.g., a polymer layer forming a carrier substrate). In one or more embodiments, the workpieces 408 are silicon layers. As shown in FIG. 4D, solid conductive structures 410 (e.g., solid solder bumps) are transferred from the mold 402 to the UBM pads 409 on the upper surface of the workpiece 408. In the process of conductive material transfer, all solder in a mold are again melted and transferred onto the UBM structure of a silicon wafer and then solidified. Unlike in solder paste joints, there is no volume change from deposition to final bump. A spacing or pitch between adjacent conductive structures 410 is set to a prescribed distance, A, so as to be in alignment with corresponding electrical contact locations on the workpiece 408. Although the invention is not limited to any specific pitch A, the spacing between adjacent conductive structures 410 should be selected such that an electrical short does not occur even after subsequent processing (e.g., wetting). In the illustrative case of the reduced volume interconnect structure shown in FIG. 4C, a width, F, of each of at least a subset of the UBM pads 409 is considerably greater (e.g., about five times or more) than the width of a corresponding one of the cavities 404.

The transferred solder can be reflowed, for example in a nitrogen environment, to make it spread radially to cover the entire pad surface before the bonding process or during the bonding process. If solder reflow is performed during the bonding process, a total thickness of the intermetallic compounds is reduced compared to a sample with reflow performed before the bonding process.

Figure 4E:
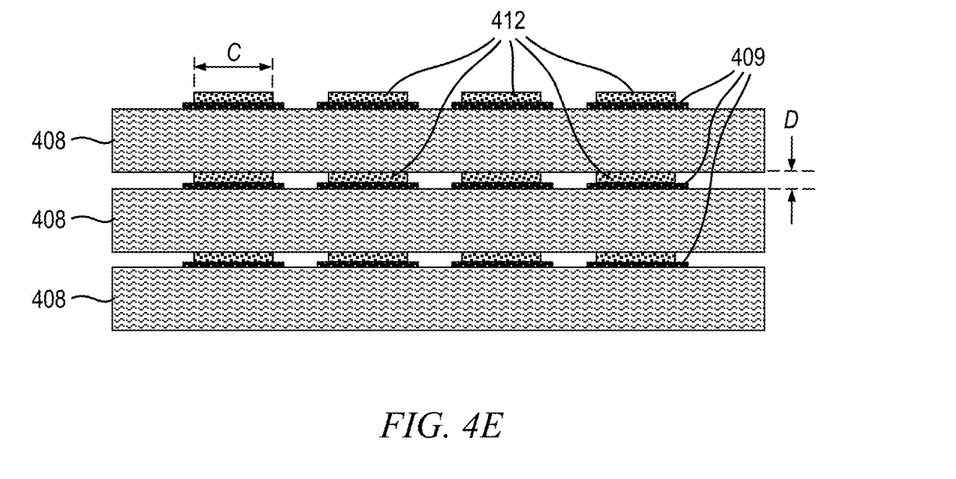

With reference now to FIG. 4E, when stacked on top of one another in a substantially vertical (z-axis) dimension, the conductive structures on corresponding workpieces (e.g., silicon layers) 408 will form interconnections 412 between adjacent workpieces. The interconnections 412 have a standoff height associated therewith which defines a minimum spacing, D, referred to herein as an interface or chip stack gap, between adjacent silicon layers 408.

With regard to a selected width for each of at least a subset of the cavities 404 shown in FIG. 4A, whereas the standard cavity widths for the mold 302 shown in FIG. 3A are typically one-half the pitch A, the cavity widths for the reduced volume interconnect structure (see FIG. 4A) are decreased considerably to about one-fifth or less of the pitch A (e.g., about 200 microns). Consequently, the resulting interconnect structure is considerably narrower than a wetting pad 409 on an underside of the corresponding silicon layers 408. In one or more embodiments, a wetting area diameter, C, is configured to be greater than about twice the diameter of the corresponding conductive structure. By way of example only and without limitation, a diameter of each of the conductive structures 410 is selected to be about 40 microns and a wetting area diameter C is selected to be about 100 microns, although embodiments of the invention are not limited to these specific dimensions.

As a result of wetting (or wet soldering), which occurs when heat from the molten conductive material (e.g., solder) melts the material forming a corresponding wetting pad (e.g., copper) thereby forming a new alloy blending the two materials together, the conductive structures 410 on the silicon layers 408 will wet out over the wetting pad and thus collapse in a vertical (z) dimension to a very small standoff height D. Depending on the type of material used to form the wetting pad (e.g., copper), to facilitate wetting of the conductive material to the wetting pad, the wetting pad is first subjected to an oxide-reducing environment, such as, for example, a fluxing means (including gaseous/vapor fluxing or liquid fluxing), according to one or more embodiments. In other embodiments, the wetting pad may be formed of a material which inhibits oxide growth, such as, for example, gold, in which case solder wetting is achieved with minimal oxide reduction. This enables the silicon layers 408 to come very close together, thus reducing the overall height of the chip stack.

With reference again to FIGS. 4A and 4D, in accordance with one or more embodiments, an aspect ratio of depth to width for each of at least a subset of the cavities 404 is selected to be between about one half to one third. The cavities are still on pitch centers that are considerably larger than cavity dimensions. These cavities are therefore adapted to hold a smaller fraction of conductive material 406 compared to the cavities 304 depicted in FIG. 3A. When these cavities 404 are filled (FIG. 4B), this reduced volume of conductive material just suffices to wet the entire wetting area of each corresponding silicon pad. However, the vertical height of this solder layer is significantly less than that of a standard solder bump. When displaced between two adjacent silicon layers 408, this causes the layers to metallurgically bond over the multiple wetting pads, but do so with a minimal spacing D therebetween compared to standard interconnection methodologies. This is highly advantageous in 3D chip stacking so as to achieve a minimal vertical footprint. Also, this arrangement provides improved thermal conductivity between the silicon layers 408, which is helpful for thermal management. Moreover, minimal standoff height produces improved electrical characteristics which are beneficial for high-frequency signal applications.

Figure 5A:
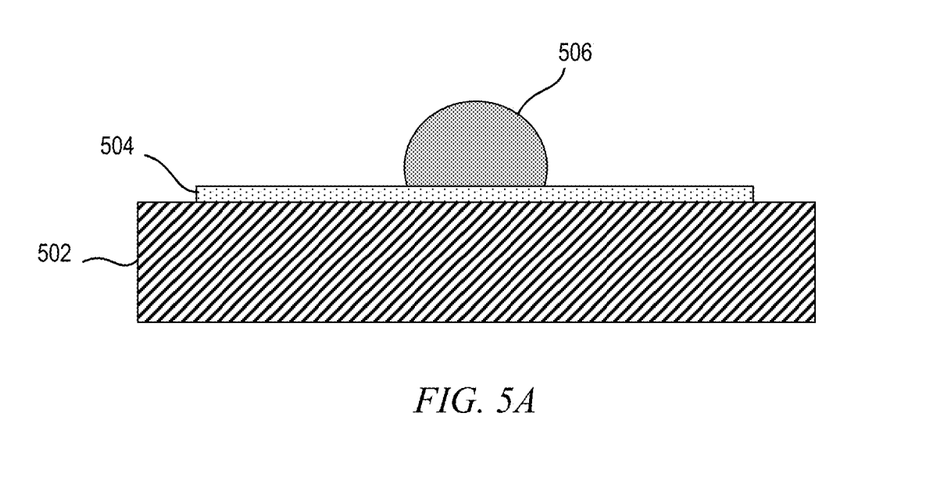
FIGS. 5A and 5B are cross-sectional views conceptually depicting solder reflow processes over an under bump metallurgy (UBM) pad using a single centered preform and multiple spaced preforms, respectively.
Figure 5B:
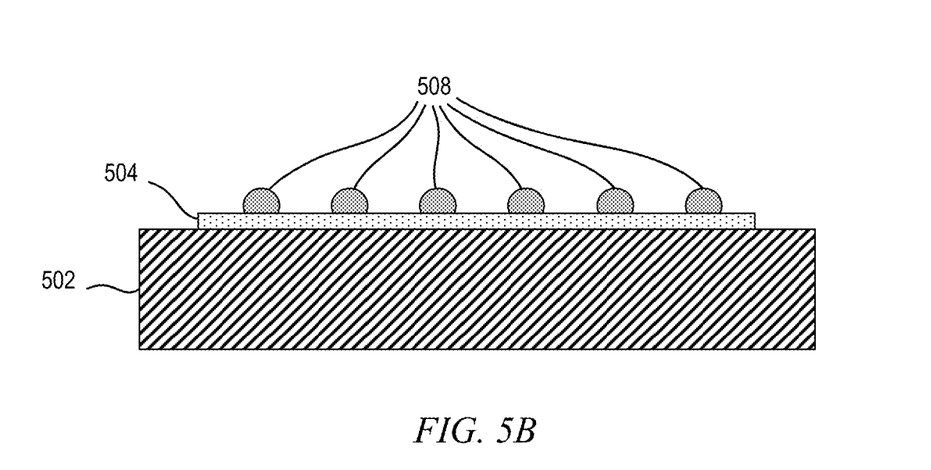

FIGS. 5A and 5B are cross-sectional views conceptually depicting illustrative solder reflow processes over a UBM pad using a single centered preform or multiple spaced preforms, respectively. With reference to FIG. 5A, a chip or other workpiece 502 includes a UBM pad 504 configured to facilitate the flow of molten conductive material on an upper surface of the workpiece. In the embodiment of FIG. 5A, a single preform 506 is used, substantially centered on the pad 504. The preform 506 is preferably a small volume solder preform, for example transferred from a mold (not explicitly shown but implied) in accordance with a known process, which may be consistent with the solder transfer process described herein above. As previously stated, the transferred solder preform 506 is reflowed, for example in a nitrogen or hydrogen environment, to make it spread radially to cover the entire pad surface before the bonding process or during the bonding process. In this embodiment, the nitrogen environment is beneficial in reducing the formation of oxide on the pad during reflow, but it will not necessarily remove native oxides on the pad; this can be achieved by subjecting the pad to an oxide-reducing environment to remove native oxides, as previously explained.

Alternatively, rather than using a single centered preform as depicted in FIG. 5A, a plurality of spaced preforms 508 may be formed on the upper surface of the pad 504, as shown in FIG. 5B. With reference to FIG. 5B, the preforms 508 are preferably small volume solder preforms, a volume of each of the preforms being less than a volume of the single preform 506 shown in FIG. 5A. The preforms 508 are reflowed, preferably in a vacuum environment to prevent the formation of voids between adjacent preforms during bonding, such that the conductive material forming the preforms (e.g., solder) spreads radially to cover the entire surface of the pad 504. Vacuum reflow is beneficial, particularly with multiple small preforms, to prevent oxide formation during reflow but will generally not remove native solder oxides; exposure to an oxide-reducing environment (e.g., a fluxing means) may be used to remove native oxides.

Figure 6A:
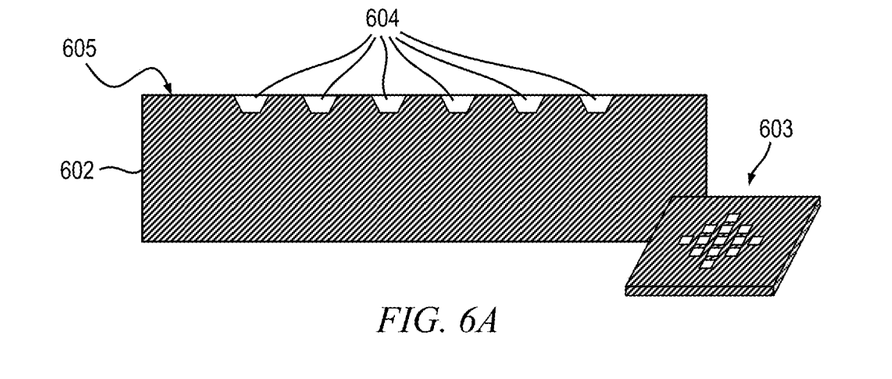
FIGS. 6A through 6E are cross-sectional views depicting at least a portion of an exemplary process for forming a three-dimensional chip stack comprising a reduced volume interconnect, according to an embodiment of the invention.

FIGS. 6A through 6E are cross-sectional views depicting at least a portion of an exemplary process for forming a 3D chip stack comprising a reduced volume interconnect, according to an embodiment of the invention. With reference to FIG. 6A, a mold 602 includes a plurality of depressions or cavities 604 in an upper surface 605 of the mold. A perspective view 603 depicts an illustrative arrangement of the cavities 604 in the mold 602. Each of the cavities 604, in this embodiment, has a trapezoidally-shaped cross section and does not extend completely through the mold 602, although it is to be appreciated that the shape and/or depth of the cavities 604 are not limited by the present invention.

The cavities 604 can be formed, in one or more embodiments, using laser ablation in polyimide, in a manner consistent with the formation of the cavities 304 shown in FIG. 3A. In one or more embodiments, a volume of the cavities in the mold 602 is configured to be less compared to the cavities 304 shown in FIG. 3A. The cavities 604 are preferably aligned with corresponding electrical contact locations on a chip or substrate and are adapted to receive solder or an alternative conductive material, which is preferably introduced into the cavities in molten form, for example via an injection molding process or the like, as will be understood by those skilled in the art. The width and depth of each of the cavities 604 will ultimately define a volume of each of the corresponding interconnect structures.

Each of the cavities 604 in the mold 602 are filled with a conductive material, such as molten solder. In an exemplary injection molding process, the mold 602 is heated to a temperature at or above the melting point of the conductive material and the molten conductive material is forced into the cavities 604. An injection plate or similar mechanism is then advanced to slide over the upper surface 605 of the mold 602 to wipe away the excess conductive material above the upper surface of the mold to thereby make the conductive material in the cavities 604 substantially planar with the upper surface of the mold.

Figure 6B:
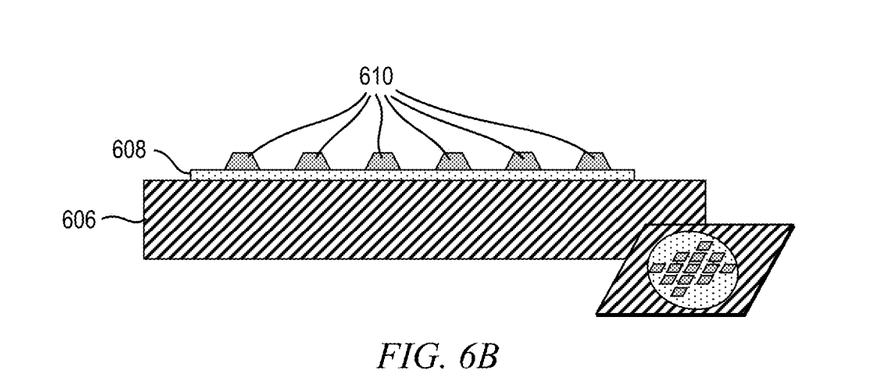
Figure 6C:
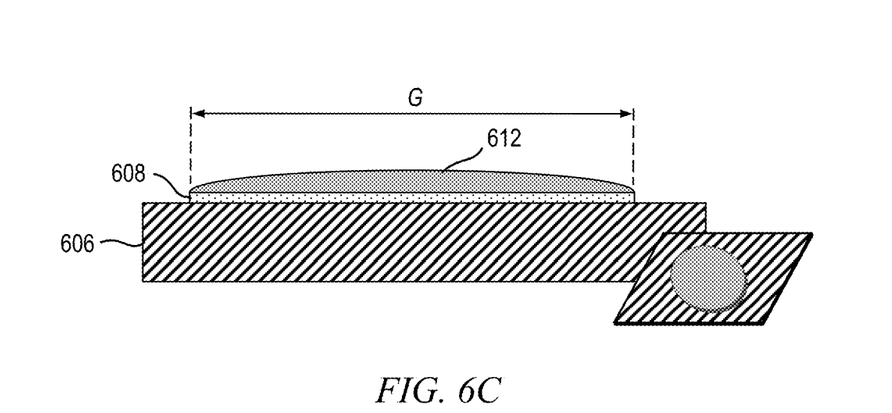

In FIG. 6B, once the molten conductive material in cavities 604 is allowed to solidify, the mold 602 is inverted and placed over a UBM pad 608, or alternative pad, configured to facilitate the flow of molten conductive material, on an upper surface of a corresponding workpiece 606. The workpiece 606 can be, for example, a semiconductor chip (a plurality of which may form a 3D chip stack), a substrate, such as, for example, silicon (e.g., semiconductor packaging substrate), or a dummy substrate onto which the injection-molded conductive material adheres (e.g., a polymer layer forming a carrier substrate). In this manner, solid conductive structures 610 (e.g., solid solder bumps) are transferred from the mold 602 to the pad 608.

In one or more embodiments, a thin bump having a larger diameter, compared to conventional methodologies, can be formed. Specifically, with reference to FIG. 6C, during a reflow process, wherein the workpiece 606 and the conductive structures 610 are exposed to elevated temperatures at least equal to the melting point of the conductive material, the conductive material forming the plurality of conductive structures 610 becomes molten and flows together over an upper surface of the pad 608 to thereby form a thin bump 612 having a larger diameter. The diameter, G, of the bump 612 will be substantially the same as a diameter of the pad on which the bump is formed. To facilitate substantially contiguous wetting over the entire surface of the pad 608, the pad is first subjected to an oxide-reducing environment (e.g., a fluxing means, such as vapor flux, formic acid, etc.) to remove native oxides on the surface thereof prior to reflow, as previously stated.

Figure 6D:
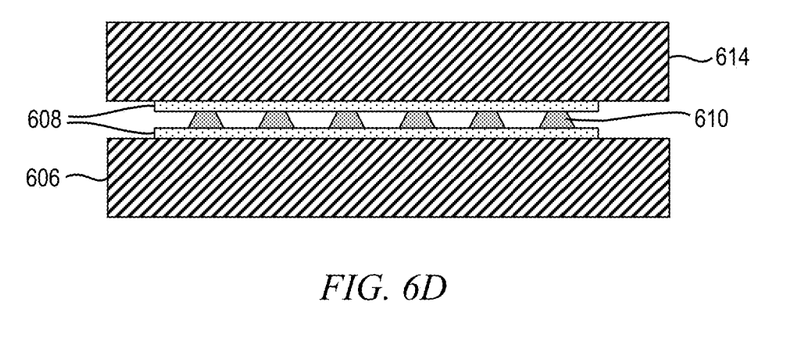

In one or more other embodiments, the low-volume conductive structures 610 are used to form a 3D chip stack having a reduced spacing between silicon chips compared to conventional processes. With reference to FIG. 6D, a second chip or workpiece 614, which, like the workpiece 606, has a UBM pad 608 formed on a surface thereof, is inverted and placed above an upper surface of the workpiece. The second chip 614 is positioned relative to the workpiece 606 such that the pads 608 of each chip are substantially aligned with one another and the conductive structures 610 are in contact with both pads.

Figure 6E:
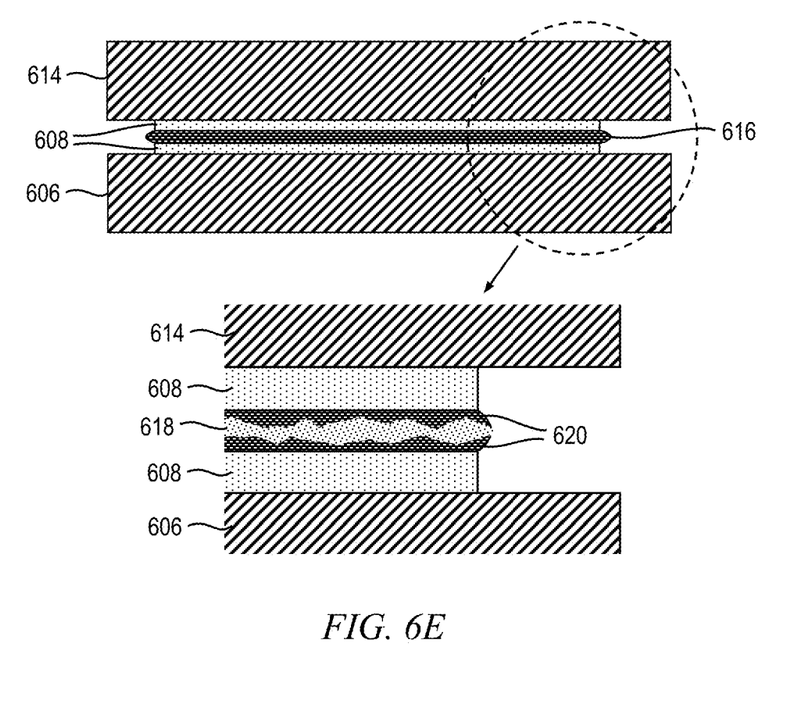

A vacuum bonding process is then performed, as shown in FIG. 6E. During the bonding process, which may be performed in a vacuum reflow oven/furnace, in one or more embodiments, the chips 606 and 614 are exposed to heat and/or joining pressure. In one or more embodiments, the pads 608 are exposed to an oxide-reducing environment (e.g., formic acid vapor) to remove native solder oxides prior to vacuum reflow. A formic acid vapor reflow is preferably performed without joining pressure, followed by vacuum reflow with joining pressure, according to one or more embodiments. The amount of heat and/or pressure applied to the chips 606, 614 is configured so as to allow the conductive structures 610 between the pads 608 to reflow and, in conjunction with the material forming pads 608, form an IMC layer 616 bonding the chips together. Depending on the type of materials used to form the pads 608 and conductive structures 610, the IMC layer 616 may comprise more than one type of intermetallic compound. By way of example only and without limitation, in one or more embodiments, the UBM pads 608 comprise copper (Cu) and the conductive structures 610 comprise tin (Sn) or tin alloy, resulting in the formation of a tin- and copper-based IMC layer 616. As shown in FIG. 6E, the IMC layer 616 is comprised of at least two different types of compounds; namely, a first compound 618, which in this embodiment comprises $Cu_6Sn_5$, formed proximate a center of the IMC layer, and a second compound 620, which in this embodiment comprises $Cu_3Sn$, formed proximate the junctions between the IMC layer and the respective pads 608. The thicknesses of the first and second compounds 618, 620 in the IMC layer 616 will be based, at least in part, on the respective volumes of the materials (e.g., tin and copper) forming the pads 608 and the conductive structures 610. In some cases where a thin IMC layer 616 is required and solder needs to remain after the bonding process, a barrier metal (e.g., nickel) forms between the conductive structures 610 and the UBM pads 608. IMC between the conductive structures 610 and the barrier metal forms at a much slower rate compared to the formation of IMC between the conductive structures and the UBM pads 608.

Given the discussion thus far, it will be appreciated that, in general terms, an exemplary method, according to an aspect of the disclosure, includes the steps of: forming a plurality of conductive structures, each of at least a subset of the conductive structures having a volume of conductive material for a corresponding under bump metallurgy (UBM) pad onto which the conductive structure is transferred that is configured such that a ratio of an unreflowed diameter of the conductive structure to a diameter of the corresponding pad is about one third-to-one or less; transferring the conductive structures to the silicon layers; stacking the silicon layers in a substantially vertical dimension such that each of the conductive structures on a given silicon layer is aligned with a corresponding electrical contact location on an underside of an adjacent silicon layer; and heating the interconnect so as to metallurgically bond multiple electrical contact locations of adjacent silicon layers in such a manner that at least a given one of the conductive structures between aligned electrical contact locations on corresponding adjacent silicon layers collapses to reduce an interconnect gap therebetween.

An exemplary method according to another aspect of the disclosure includes the steps of: forming a plurality of conductive structures; transferring the conductive structures to the silicon layers; stacking the silicon layers in a substantially vertical dimension such that each of the conductive structures on a given silicon layer is aligned with a corresponding electrical contact location on an underside of an adjacent silicon layer; and heating the interconnect so as to metallurgically bond multiple electrical contact locations of adjacent silicon layers in such a manner that at least a given one of the conductive structures between aligned electrical contact locations on corresponding adjacent silicon layers collapses to reduce an interconnect gap therebetween. Each of at least a subset of the conductive structures is formed having a volume of conductive material that is configured such that a percentage of intermetallic compounds in a junction between the conductive structure and corresponding aligned under bump metallurgy (UBM) pads formed on corresponding opposing surfaces of adjacent silicon layers is about forty percent or more of a total volume of conductive material.

A reduced volume electrical interconnect for a 3D chip stack, according an aspect of the disclosure, includes: multiple silicon layers having multiple electrical contact locations formed on a surface thereof; multiple UBM pads, each of the UBM pads being formed between a corresponding one of the silicon layers and a corresponding one of the electrical contact locations; and multiple conductive structures, each of the conductive structures being aligned with a corresponding one of the electrical contact locations and having a volume of conductive material for a corresponding one of the UBM pads that is configured such that a ratio of an unreflowed diameter of the conductive structure to a diameter of the corresponding pad is about one third-to-one or less. The interconnect is configured having the plurality of silicon layers stacked in a substantially vertical dimension such that each of the conductive structures on a given silicon layer is aligned with a corresponding electrical contact location on an underside of an adjacent silicon layer. The conductive structures, when heated to a prescribed temperature, metallurgically bond the electrical contact locations of adjacent silicon layers in such a manner that at least a given one of the conductive structures between aligned electrical contact locations on corresponding adjacent silicon layers collapses to thereby reduce an interconnect gap therebetween.

A reduced volume electrical interconnect for a 3D chip stack according another aspect of the disclosure includes: multiple silicon layers having multiple electrical contact locations formed on a surface thereof; multiple UBM pads, each of the UBM pads being formed between a corresponding one of the silicon layers and a corresponding one of the electrical contact locations; and multiple conductive structures. Each of the conductive structures is aligned with a corresponding one of the electrical contact locations and has a volume of conductive material for a corresponding one of the UBM pads that is configured such that a ratio of an unreflowed diameter of the conductive structure to a diameter of the corresponding pad is about one third-to-one or less. Each of at least a subset of the conductive structures is formed having a volume of conductive material that is configured such that a percentage of intermetallic compounds in a junction between the conductive structure and corresponding aligned UBM pads formed on corresponding opposing surfaces of adjacent silicon layers is about forty percent or more of a total volume of conductive material.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of forming a reduced volume interconnect for a chip stack including a plurality of silicon layers, the method comprising:
   forming a plurality of conductive structures, each of at least a subset of the conductive structures having a volume of conductive material for a corresponding under bump metallurgy (UBM) pad onto which the conductive structure is transferred that is configured such that a ratio of an unreflowed diameter of the conductive structure to a diameter of the corresponding pad is about one third-to-one or less;
   transferring the conductive structures to the silicon layers;
   stacking the silicon layers in a substantially vertical dimension such that each of the conductive structures on a given silicon layer is aligned with a corresponding electrical contact location on an underside of an adjacent silicon layer; and
   heating the interconnect so as to metallurgically bond multiple electrical contact locations of adjacent silicon layers in such a manner that at least a given one of the conductive structures between aligned electrical contact locations on corresponding adjacent silicon layers collapses to reduce an interconnect gap therebetween;
   wherein transferring the conductive structures to the silicon layers comprises transferring at least two of the plurality of conductive structures to a single corresponding UBM pad, an aggregate volume of conductive material forming the at least two conductive structures being substantially equal to a volume of a single conductive structure having a ratio of an unreflowed diameter of the single conductive structure to the diameter of the corresponding pad of about one third-to-one or less.

2. The method of claim 1, wherein transferring the conductive structures to the silicon layers comprises:
   aligning each of the conductive structures with the corresponding UBM pad formed on a corresponding one of the silicon layers; and
   transferring each of the conductive structures to the corresponding UBM pad.

3. The method of claim 1, further comprising:
   providing a mold including a plurality of cavities in an upper surface of the mold, a width and a depth of each of the cavities defining a volume of each of the corresponding interconnect structures;
   filling each of the plurality of cavities with molten conductive material such that the molten conductive material is substantially planar with the upper surface of the mold, the molten conductive material in each of the plurality of cavities forming a corresponding one of the plurality of conductive structures.

4. The method of claim 3, wherein each of at least a subset of the plurality of cavities has a cross section that is substantially trapezoidal in shape and extends partially into the mold from the upper surface of the mold.

5. The method of claim 1, wherein the step of heating comprises heating the interconnect so as to allow at least a subset of the plurality of conductive structures between corresponding UBM pads formed on corresponding opposing surfaces of adjacent silicon layers to reflow and, in conjunction with material forming the UBM pads, form an intermetallic compound (IMC) layer bonding the adjacent silicon layers together.

6. The method of claim 1, further comprising applying pressure while heating the interconnect, a prescribed combination of temperature and pressure being applied so as to allow the plurality of conductive structures between corresponding UBM pads formed on corresponding opposing surfaces of adjacent silicon layers to reflow and, in conjunction with material forming the UBM pads, form an intermetallic compound (IMC) layer bonding the adjacent silicon layers together.

7. The method of claim 1, wherein the step of heating the interconnect comprises heating the interconnect in a nitrogen environment, so as to allow at least a subset of the plurality of conductive structures between corresponding UBM pads formed on corresponding opposing surfaces of adjacent silicon layers to reflow, whereby conductive material forming the subset of the plurality of conductive structures spreads radially to substantially cover an upper surface of the corresponding UBM pads.

8. The method of claim 1, wherein the step of heating the interconnect is performed in a vacuum environment configured to reduce a likelihood of void formation during bonding of multiple corresponding electrical contact locations.

9. The method of claim 1, wherein heating of the interconnect is performed such that each of the conductive structures forms intermetallic compounds in a junction between the conductive structure and the corresponding UBM pad formed on a surface of a corresponding one of the silicon layers.

10. The method of claim 9, wherein heating of the interconnect comprises reflowing the conductive structures concurrent with bonding the multiple electrical contact locations of adjacent silicon layers to reduce a thickness of the intermetallic compounds formed in respective junctions between the conductive structures and corresponding UBM pads.

11. The method of claim 9, wherein heating of the interconnect comprises reflowing the conductive structures prior to bonding the multiple electrical contact locations of adjacent silicon layers.

12. The method of claim 1, wherein the volume of conductive material forming each of at least a subset of the conductive structures is configured such that a percentage of intermetallic compounds in a junction between the conductive structure and corresponding aligned UBM pads is about forty percent or more of a total volume of conductive material.

13. The method of claim 1, further comprising exposing the interconnect to an oxide-reducing environment to remove at least a portion of native oxide on a surface of corresponding aligned UBM pads, the step of exposing the interconnect to the oxide-reducing environment being performed prior to heating the interconnect.

* * * * *